United States Patent [19]
Cheung et al.

[11] Patent Number: 6,154,059
[45] Date of Patent: Nov. 28, 2000

[54] HIGH PERFORMANCE OUTPUT BUFFER

[75] Inventors: Sammy Cheung, Pleasanton; John Lam, Union City; Rakesh Patel, Cupertino; Tony Ngai, Campbell, all of Calif.

[73] Assignee: Altera Corporation, San Jose, Calif.

[21] Appl. No.: 09/199,705

[22] Filed: Nov. 24, 1998

Related U.S. Application Data

[60] Provisional application No. 60/066,841, Nov. 25, 1997.

[51] Int. Cl.[7] .................. H03K 19/0175; H03K 19/094; H03K 19/003
[52] U.S. Cl. ................................ 326/83; 326/112; 326/23
[58] Field of Search .................................. 326/83, 80, 81, 326/82, 86, 112, 119, 121, 22, 23, 26–27, 17, 56–58; 327/176

[56] References Cited

U.S. PATENT DOCUMENTS

| | | | |
|---|---|---|---|
| 4,216,390 | 8/1980 | Stewart | 326/81 |
| 4,506,164 | 3/1985 | Higuchi | 326/81 |
| 5,583,451 | 12/1996 | Sharpe-Geisler | 326/49 |
| 5,862,390 | 1/1999 | Ranjan | 713/300 |
| 5,986,489 | 11/1999 | Raza et al. | 327/170 |

*Primary Examiner*—Michael Tokar
*Assistant Examiner*—James H Cho
*Attorney, Agent, or Firm*—William S. Galliani; Pennie & Edmonds LLP

[57] ABSTRACT

An output buffer has internal circuitry connected between an input node and an output node. The internal circuitry includes a quiet voltage supply connected to a first set of transistors of the internal circuitry and a noisy voltage supply connected to a second set of transistors of the internal circuitry. The noisy voltage supply is at a voltage level higher than the quiet voltage supply. The first set of transistors and the second set of transistors provide isolation between the noisy voltage supply and the quiet voltage supply. The first set of transistors and the second set of transistors also provide complete digital high and low internal signal levels by using at least one transistor operative to supplement the complete shut-off and turn-on of transistors of the first set of transistors and the second set of transistors. The output buffer also features a ground bounce circuit, a slew rate control circuit, a transition accelerator circuit, a Personal Computer Interface (PCI) compatibility circuit, and a PCI control circuit.

16 Claims, 5 Drawing Sheets

HIGH PERFORMANCE OUTPUT BUFFER

This application claims priority to the provisional application entitled: "High Performance Output Buffer that Supports Multiple Supply Voltages", Ser. No. 60/066,841, filed Nov. 25, 1997.

BRIEF DESCRIPTION OF THE INVENTION

This invention relates generally to integrated circuits. More particularly, this invention relates to an output buffer for use in mixed-voltage systems.

BACKGROUND OF THE INVENTION

Digital systems are commonly embedded on printed circuit boards. Different integrated circuits positioned on a printed circuit board may operate at different voltages. For example, with improvements in process technology, integrated circuits use lower power supply voltages, such as 3.3 Volts or 2.5 Volts, or even lower. Integrated circuits made with these processes should remain compatible with previous generations of integrated circuits. For example, a new generation 3.3 Volt integrated circuit may need to be used on a printed circuit board with an old generation 5 Volt integrated circuit. Systems of this type are commonly referred to as mixed-voltage systems.

The 3.3 Volt integrated circuit will need to have the proper supply and input voltages for operation. In addition, the 3.3 Volt integrated circuit should supply or generate the proper output voltages for interfacing with the other integrated circuits. Proper interfacing of the integrated circuits is essential for proper functional operation. Further, proper interfacing will prevent undesirable conditions, such as overstressing the devices, avoiding possible high current or latch-up conditions, and other similar concerns, thereby improving device longevity.

Some circuit architectures rely upon separate noisy and quiet supply voltage schemes. For example, an I/O driver may be coupled to a noisy supply while the on-chip conversion circuitry is coupled to the quiet supply. This will provide some isolation from noise at the I/O driver from being coupled to other on-chip circuitry. Both the noisy and quiet supplies may be connected to the same voltage level. However, the noisy power supply would be connected to a separate pin from a quiet power supply. On the integrated circuit, the noisy power supply is connected to circuitry which generates or is subject to noise, while the quiet power supply is connected to relatively quiet circuitry. By separating the power supplies in this fashion, the circuitry connected to the quiet power supply is isolated somewhat from switching and other types of noise present or the noisy power supply.

In prior art devices, Vccq has been set at the same value as Vccn. It would be desirable to provide a circuit where Vccn is higher (e.g., 3.3 Volts) than Vccq (e.g., 2.5 Volts). The problem with such a scheme is that the gate drive (Vgs) to the output driver NMOS pull-down transistor of the output buffer may be at Vccq, while other parts of the circuit are at the higher Vccn level. Thus, it is difficult for the pull-down transistor to completely pull the output node to a digital low value. This degrades performance, especially when multiple outputs are switching. In addition, since the quiet mode supply voltage (Vccq) and the noisy mode supply voltage (Vccn) may not track each other, a worse case output delay can happen when Vccn=3.6 Volts and Vccq=2.25 Volts, as the output buffer tries to pull the output from 3.6 V to 0V. This problem did not exist in prior art devices where Vccn was always less than Vccq.

Another design challenge for output buffers in mixed-voltage systems is to support high and low signals in the Personal Computer Interface (PCI) bus protocol. Observing the PCI bus protocol requires large output driver transistors. This causes both Vcc sag and ground bounce problems that are not experienced in non-PCI systems. In addition, the larger output driver transistors result in larger die sizes.

In view of the foregoing, it would be highly desirable to provide an improved output buffer for use in mixed-voltage systems. More particularly, it would be highly desirable to provide an improved output buffer that supports a noisy internal supply voltage that is higher than a quiet internal supply voltage. Further, it would be highly desirable to provide both PCI compatibility and tolerance to high voltages (e.g., 5 Volts) in a mixed-voltage system.

SUMMARY OF THE INVENTION

An output buffer has internal circuitry connected between an input node and an output node. The internal circuitry includes a quiet voltage supply connected to a first set of transistors of the internal circuitry and noisy voltage supply connected to a second set of transistors of the internal circuitry. The noisy voltage supply is at a voltage level higher than the quiet voltage supply. The first set of transistors and the second set of transistors provide isolation between the noisy voltage supply and the quiet voltage supply. The first set of transistors and the second set of transistors also provide complete digital high and low internal signal levels by using at least one transistor operative to supplement the complete shut-off and turn-on of transistors of the first set of transistors and the second set of transistors. The output buffer also features a ground bounce circuit, a slew rate control circuit, a transition accelerator circuit, a Personal Computer Interface (PCI) compatibility circuit, and a PCI control circuit.

The circuit of the invention provides high performance and low noise output in mixed-voltage systems. The design of the invention is scalable. Therefore, when process minimum features scale down, the power supply of the invention scales down from 5V to 3.3V and from 3.3V to 2.5V (and/or 1.8V). The circuit of the invention allows the use of a noisy internal supply voltage that is higher than a quiet internal supply voltage. Advantageously, the circuit of the invention will also operate correctly when the noisy voltage supply is equal to or less than the quiet voltage supply. The invention also supports PCI compatibility and tolerance to high voltages (e.g., 5 Volts) in a mixed-voltage system.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Figure 1:
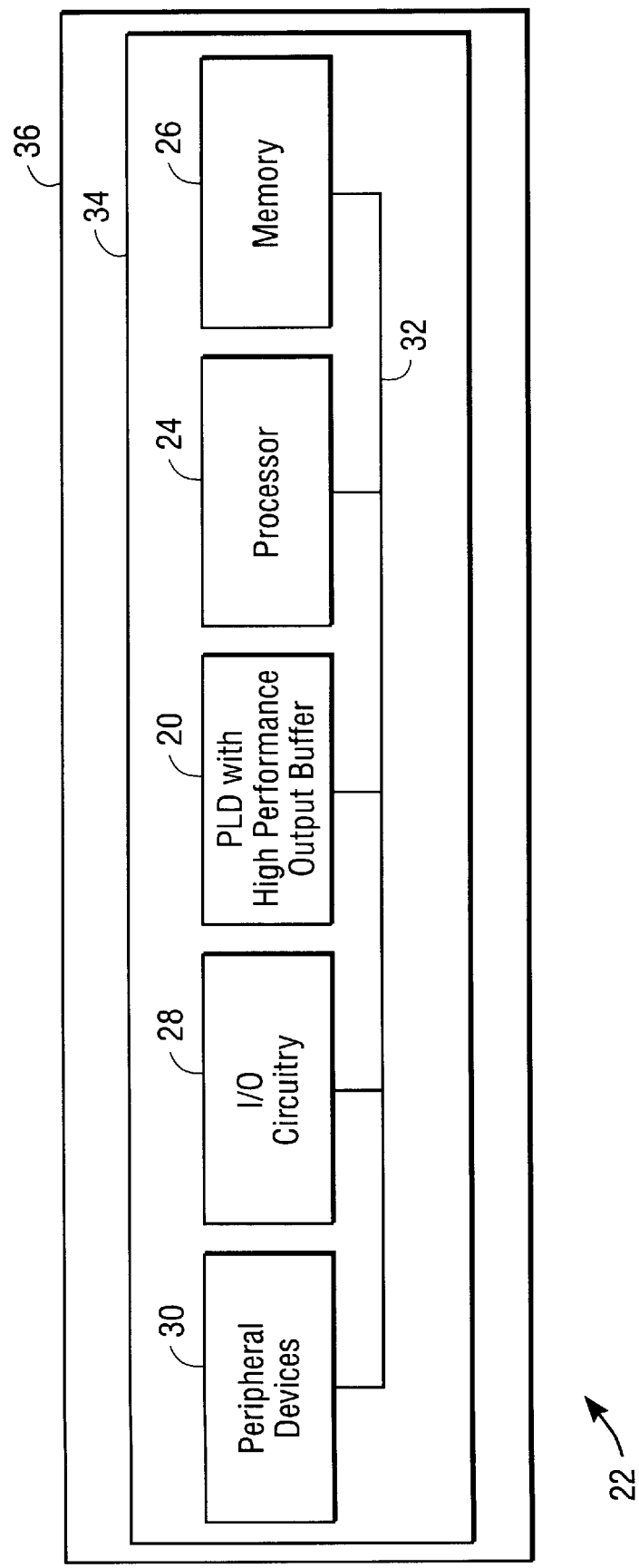
FIG. 1 illustrates a data processing system utilizing a programmable logic device with an output buffer constructed in accordance with an embodiment of the invention.

FIG. 1 illustrates a programmable logic device (PLD) 20 incorporating an output buffer in accordance with the invention. PLDs (sometimes referred to as PALs, PLAs, FPLAs, PLDs, EPLDs, EEPLDs, LCAs, or FPGAs) are well-known integrated circuits that provide the advantages of fixed integrated circuits with the flexibility of custom integrated circuits. Such devices allow a user to electrically program standard, off-the-shelf logic elements to meet a user's specific needs. See, for example, U.S. Pat. No. 4,617,479, incorporated herein by reference for all purposes. Such devices are currently represented by, for example, Altera's MAX® series of PLDs and FLEX® series of PLDs. The former are described in, for example, U.S. Pat. Nos. 5,241, 224 and 4,871,930, and the Altera Data Book, June 1996, all incorporated herein by reference. The latter are described in, for example, U.S. Pat. Nos. 5,258,668; 5,260,610; 5,260, 611; and 5,436,575, and the Altera Data Book, June 1996, all incorporated herein by reference.

The PLD 20 forms a part of a data processing system 22. The data processing system 22 may include one or more of the following components: a processor 24, a memory 26, input/output circuitry 28, and peripheral devices 30. These components are coupled together by a system bus 32 and are populated on a circuit board 34, which is contained in an end-user system 36. By way of example, the PLD 20 may operate at 3.3 Volts, while the remaining components on the printed circuit board 34 operate at 5 Volts.

The system 22 can be used in a wide variety of applications, such as computer networking, data networking, instrumentation, video processing, digital signal processing, or any other application where the advantage of using re-programmable logic is desirable. The PLD 20 can be used to perform a variety of logic functions. For example, the PLD 20 can be configured as a processor or controller that works in cooperation with processor 24. The PLD 20 may also be used as an arbiter for arbitrating access to a shared resource in the system 22. In yet another example, the PLD 20 can be configured as an interface between the processor 24 and one of the other components in the system 22.

Figure 2:
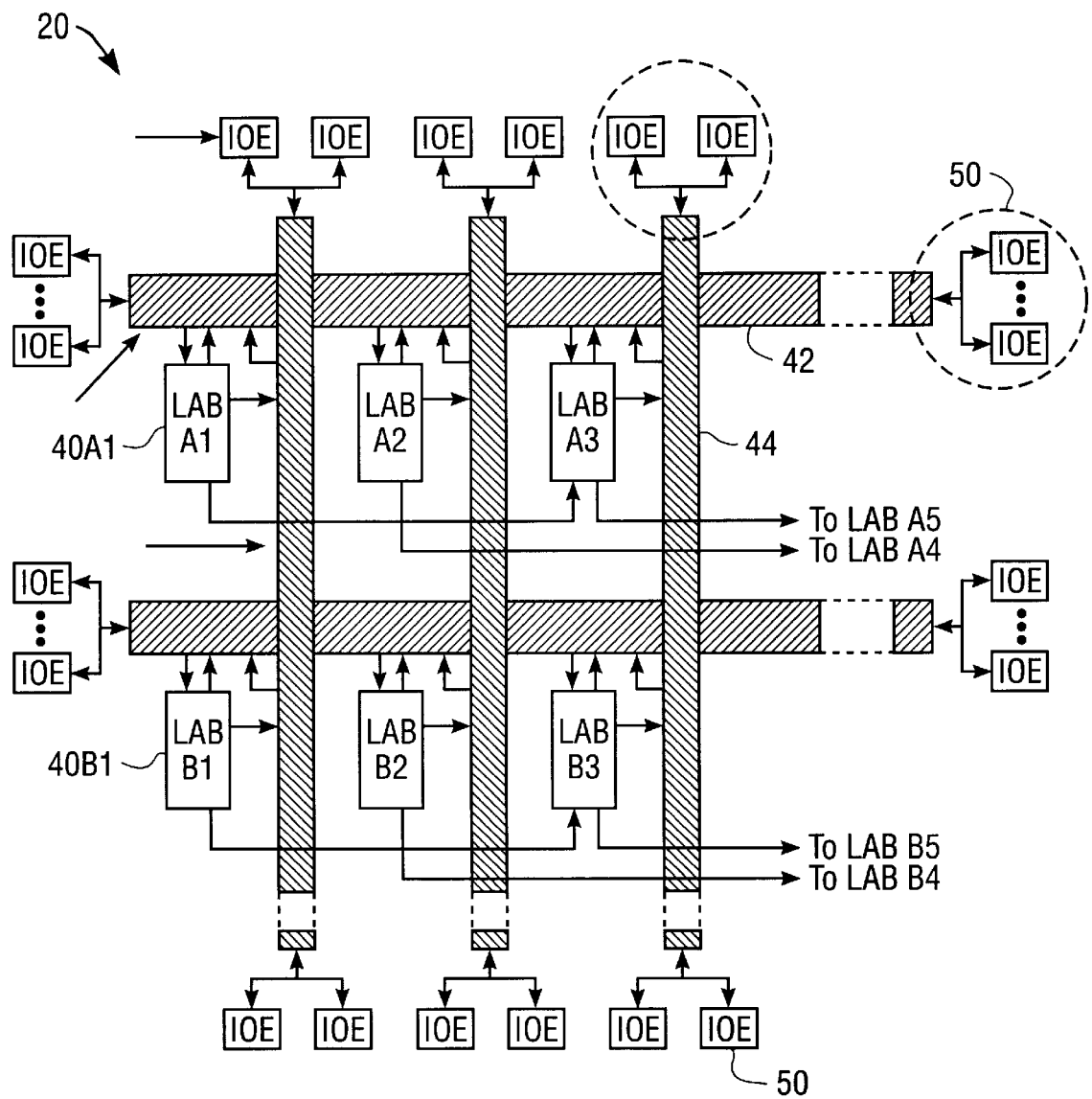
FIG. 2 illustrates a programmable logic device constructed in accordance with an embodiment of the invention.

FIG. 2 illustrates a programmable logic device 20 in accordance with the invention. The programmable logic device 20 includes a set of logic array blocks 40. As known in the art, a logic array block 40 performs programmed logic operations. Row interconnect circuitry 42 and column interconnect circuitry 44 link the various logic array blocks 40. Row interconnect circuitry 42 and column interconnect circuitry 44 are known in the art. The invention may be constructed using logic array blocks 40, row interconnect circuitry 42, and column interconnect circuitry 44 of the type used in the MAX® and FLEX® series of PLDs sold by Altera Corporation, San Jose, Calif.

Input/output elements 50 are positioned at the ends of the row interconnect circuitry 42 and column interconnect circuitry 44. The input/output elements 50 are used for standard input/output functions. The input/output elements 50 include input buffers and output buffers. The input buffers may be implemented using prior art architectures. On the other hand, the output elements or output buffers are constructed in accordance with the invention, as described below.

Figure 3:
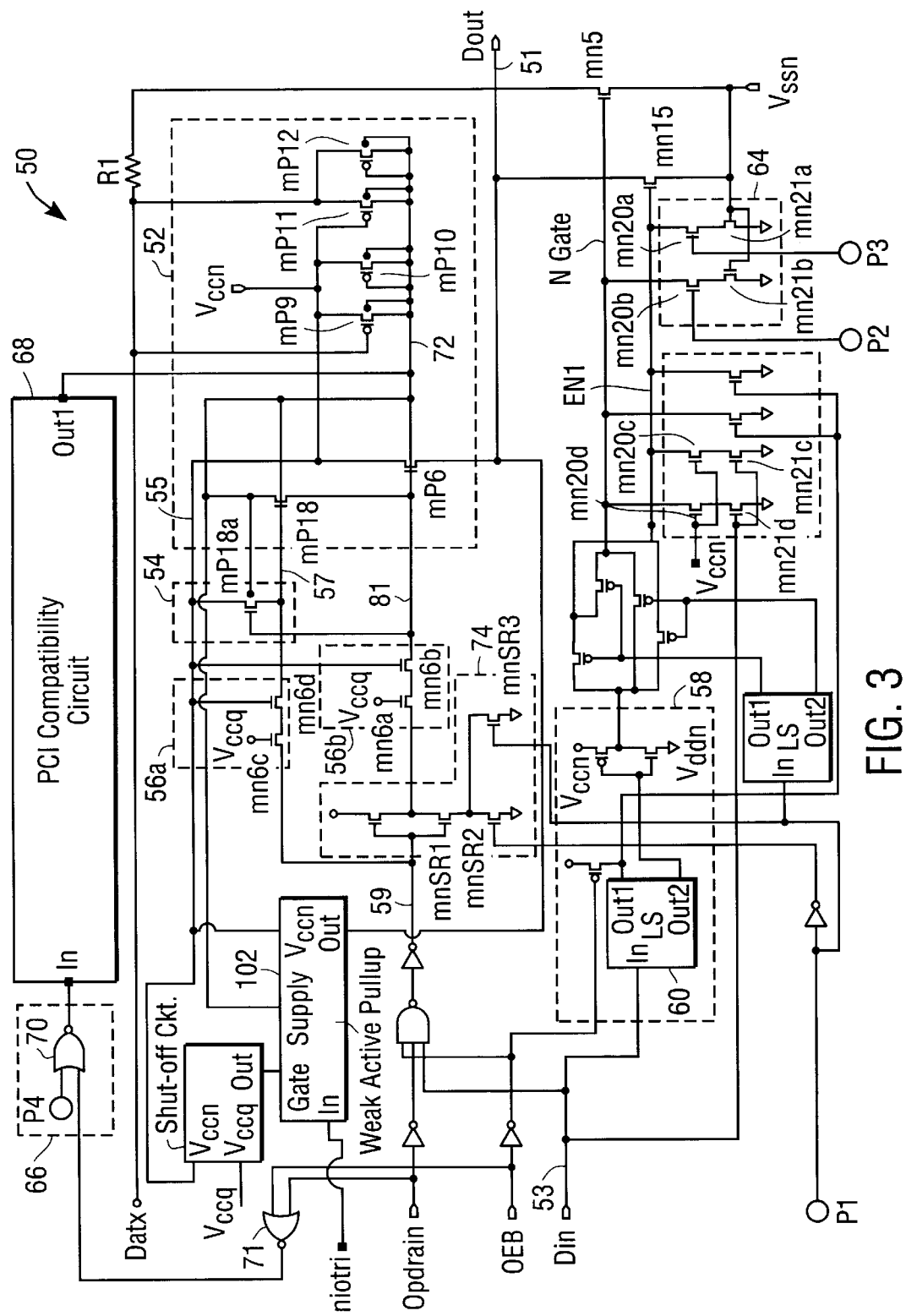
FIG. 3 illustrates an output buffer constructed in accordance with an embodiment of the invention.

FIG. 3 illustrates an output buffer 50 constructed in accordance with an embodiment of the invention. The output buffer includes an output node 51 and an input node 53. The output buffer 50 is disclosed as including a set of functional blocks, which are individually discussed below.

An important design feature of the output buffer 50 is that it supports a noisy supply voltage Vccn that is higher than a quiet supply voltage Vccq. For example, the invention has been implemented with Vccn at 3.3 Volts and Vccq at 2.5 Volts. Recall that in prior art devices Vccn is the same or lower than Vccq. While the circuit of the invention allows Vccn to be greater than Vccq, it is also operative when Vccn is the same as or lower than Vccq.

One functional block of the output buffer 50 is a floating well circuit 52. The floating well circuit 52 is constructed to create a voltage on the output node 51 that is higher than Vccn. The floating well circuit 52 includes four PMOS transistors MP9, MP10, MP11, and MP12, which control the well of the output node pull-up transistor MP6. A floating well circuit 52 that may be utilized in accordance with the invention is described in the application entitled "Interface for Low-Voltage Semiconductor Devices", Ser. No. 08/863, 876, which is assigned to the Assignee of the present invention, and which is incorporated by reference herein. The architecture of the floating well circuit 52 is the same as that described in Ser. No. 08/863,876, but operates differently in view of the functional blocks discussed below. In particular, in this invention the floating well circuit 52 operates to support a Vccn that is higher than Vccq.

Another functional block of the output buffer 50 is the noisy supply voltage (Vccn) support circuit 54. This circuit, implemented as a single transistor in this embodiment, facilitates making Vccn higher than the quiet supply voltage (Vccq). By way of example, Vccq may be 2.5 volts, and Vccn is some value higher than 2.5 volts, such as 3.3 Volts. Transistor MP18A of block 54 is controlled so that transistor MP18 can be completely shut-off. That is, the Vccn voltage on node 57 is sufficient to completely shut-off MP18. Consequently, transistor MP18A facilitates a Vccn that is higher than Vccq.

The dual supply voltage support circuits 56A and 56B operate to facilitate two different Vcc levels. Controlling the series transistors of either block allows Vccn to be higher than Vccq or vice versa. That is, transistors MN6C and MN6D of block 56A or transistors MN6A and MN6B of block 56B can be controlled to allow either Vccn or Vccq to have a higher voltage level. The series transistors prevent leakage between voltage supplies. For example, in block 56A if transistor MN6C receives a Vccq gate voltage of 2.5V, node 59 will have a voltage of 2.5V minus the threshold drop from transistor MN6C. Thus, the inverter connected to node 59 is isolated from higher Vccn voltages. The series transistors MN6A and MN6B of block 56B operate in the same manner.

Figure 4:
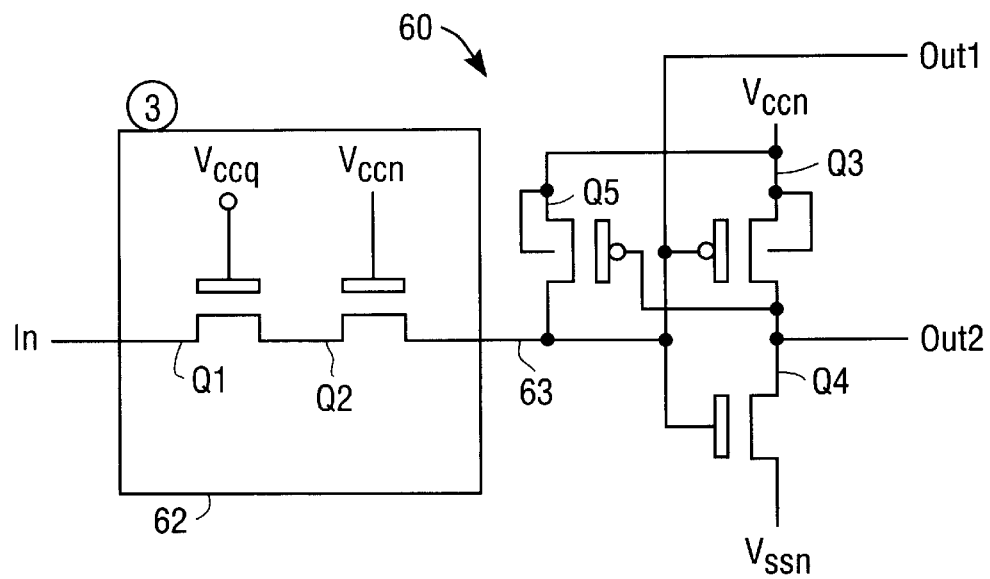
FIG. 4 illustrates a level shifting sub-block circuit in accordance with an embodiment of the invention

Functional block 58 is a level shifting circuit. The internal Vcc can be lower than the Vcc for the output driver, so the voltage level of the DIN and OEB internal signals is translated to the Vccn level. FIG. 4 is a more detailed illustration of the level shifting circuit sub-block 60 of the level shifting circuit 58.

The level shifting sub-block 60 includes series transistor block 62, with series transistors Q1 and Q2, which operate in the same manner as previously described blocks 56A and 56B. Transistors Q3, Q4, and Q5 perform the voltage level shifting operation. Transistors Q3 and Q4 form an inverter for the second output node (OUT2). The voltage shifting PMOS transistor Q5 operates to insure that the output node (OUT1) goes to a full Vccn, even when a Vccq voltage level is passed from node IN to node 63 via transistors Q1 and Q2. For example, assume that Vccq on the level shifting circuit intermediate input node 63 is at 2.5 Volts. Thus, the node OUT1 is only at 2.5 Volts. Transistor Q5 operates to allow the OUT1 node to reach a Vccn level of, for example, 3.3 Volts. This is achieved in the following manner. The Vccq voltage of 2.5 Volts on node 63 causes transistor Q4 to turn-on, pulling the OUT2 node low, which causes transistor Q5 to turn-on. Transistor Q5 thereby connects Vccn to node 63, allowing the OUT1 node to have a Vccn voltage level. Furthermore, the higher Vccn voltage at node 63 operates to completely shut-off transistor Q3, thereby insuring a complete digital low value at the node OUT2. Thus, the invention utilizes an additional PMOS gate (Q5) to completely shut-off gate Q3 and completely turn-on gate Q4.

Thus, despite the lower Vccq operating voltage, a larger Vccn output signal is achieved in accordance with this aspect of the invention. The level shifting circuit 58 allows a smaller output driver to be used, therefore a smaller die size results.

Functional block 64 is a noise control circuit. The circuit 64 senses when the ground bounce exceeds a predetermined threshold, and then shuts-off the output buffer 50. This operation is implemented, by way of example, with four transistors MN20A, MN20B, MN21A, and MN21B. The gates of MN20A and MN20B are respectively tied to programmable bits P3 and P2. The programmable bits are selectively programmed to turn-on or shut-off the transistors MN20A and MN20B. If transistors MN20A and MN20B are on, their ability to pull down nodes NGATE and EN1 is controlled by transistors MN21A and MN21B. The gates of transistors MN21A and MN21B are tied to Vssn. When Vssn rises in the presence of ground bounce, the transistors MN21A and MN21B turn-on. Thus, the series transistors MN20A and MN21A are turned on and pull the EN1 node low, causing transistor MN15 to shut-off. Similarly, the series transistors MN20B and MN21B are turned on and pull the NGATE node low, causing transistor MN5 to shut-off. The larger, the ground bounce, the faster the transistors turn-on and the faster the pull-down nodes MN15 and MN5 turn-off.

Functional block 66 is a PCI control circuit for the PCI compatibility circuit 68. The PCI compatibility circuit 68 supports compliance with the PCI protocol. In particular, the PCI circuit 68 assists in the control of the floating well of transistor MP6 to facilitate compliance with the PCI protocol. The PCI control circuit 66 of the invention extends the functionality of the PCI circuit 68 such that the output buffer 50 has PCI compatibility plus high voltage (e.g, 5 Volt) tolerance.

The PCI control circuit 66 may be implemented with a NOR gate 70. One input to the NOR gate 70 is controlled by a programmable RAM bit P4. The other input to the NOR gate is connected to the output of NOR gate 71, which receives a an open drain signal (OPDRAIN) and an output enable signal (OEB). The RAM bit P4 is used to enable or disable the PCI compatibility circuit 68, as discussed below.

Figure 5:
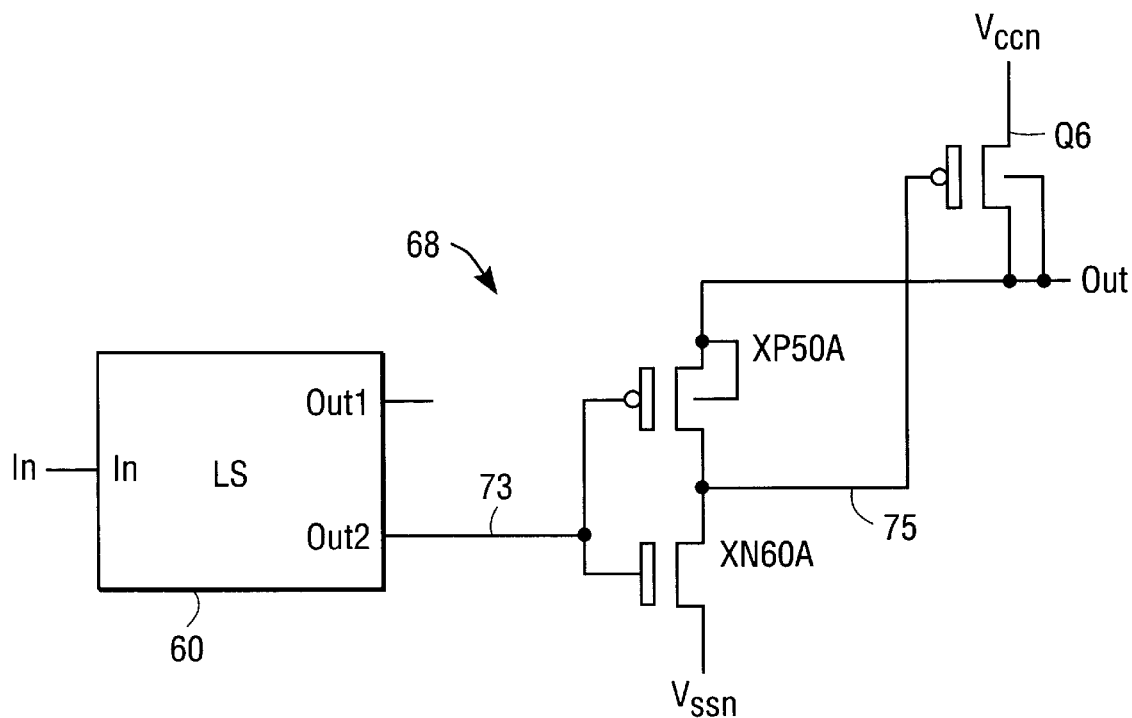
FIG. 5 illustrates a PCI compatibility circuit constructed in accordance with an embodiment of the invention.

FIG. 5 illustrates an embodiment of the PCI compatibility circuit 68. The input node of circuit 68 is the output node of the control circuit 66. The input signal is level shifted. This may be done with the level shifting circuit of FIG. 4. Output node 2 (OUT2) of FIG. 4 is used as an input to the remainder of the circuit. Therefore, an inverted version of the input signal is processed. A digital high signal at node 73 causes transistor XN60A to turn-on, pulling node 75 low, which causes transistor Q6 to turn-on. As a result, the OUT node is driven to Vccn. This signal is then applied to node 72 of FIG. 3, thereby shorting the well of transistor MP6 to Vccn. The Vccn signal on node 72 supports PCI bus compatibility at 3.3 Volts. This mode is operative when the output signal at the OUT node is enabled (a digital high value).

A digital low signal at node 73 causes transistor XP50A to turn-on, thereby turning transistor Q6 off. The output node is then floating. This allows node 72 (the well of transistor MP6) to follow the voltage level at Dout. In this mode, the output buffer is not PCI compatible, but it can tolerate 5 Volts at its output node. This mode is operative when the output signal is disabled.

Observe that by setting the programmable bit P4 of FIG. 3 to a digital high value, the output of gate 70 will always be a digital low value, thereby providing PCI compatibility. On the other hand, if the programmable bit P4 is set to a digital low value, the output of gate 70 will be controlled by the output of NOR gate 71.

Thus, in accordance with the invention, the functionality of a PCI compatibility circuit can be extended to alternately support PCI compatibility and 5 Volt tolerance. The PCI compatibility is achieved by controlling the well of the pull-up transistor MP6. Thus, large output driver transistors are not necessary. Since large output driver transistors are not necessary, Vcc sag and ground bounce problems are reduced, as is the size and cost of the die used to implement the circuit.

Functional block 74 is a slew rate control circuit used to control how fast the output on node 51 can be pulled-up to a digital high value. The faster node 81 is pulled to a digital low value, the faster transistors MP6 turns-on and thereby drives a digital high value onto node 51. The slew rate control circuit relies upon programmable pull-down transistors MNSR2 and MNSR3, which have different resistivities to selectively control the pull-down rate. An inverter INV2 and programmable RAM bit P1 are used to activate one of the pull-down transistors to establish a pull-down rate based upon the transistor resistivity. When transistor MNSR1 receives a digital high signal, it turns-on and is discharged through one of the programmed transistors (MNSR2 or MNSR3).

Functional block 76 operates as a transition accelerator circuit. The transition accelerator circuit 76 shuts-off the main NMOS output drivers, pull-down transistors MN5 and MN15. This function is achieved by providing an early shut-off of the pull-down transistors to minimize crow-bar current flowing through the output driver. A digital high data input signal (DIN) turns-on transistors MN21D and MN21C, which pulls the gates of transistors MN5 and MN15 low. As a result, transistors MN5 and MN15 are turned-off. This accelerated transition to the off state substantially reduces the occasions when transistors MN5 and MN15 are conducting while MP6 is conducting. Thus, crow bar current is substantially eliminated.

Figure 6:
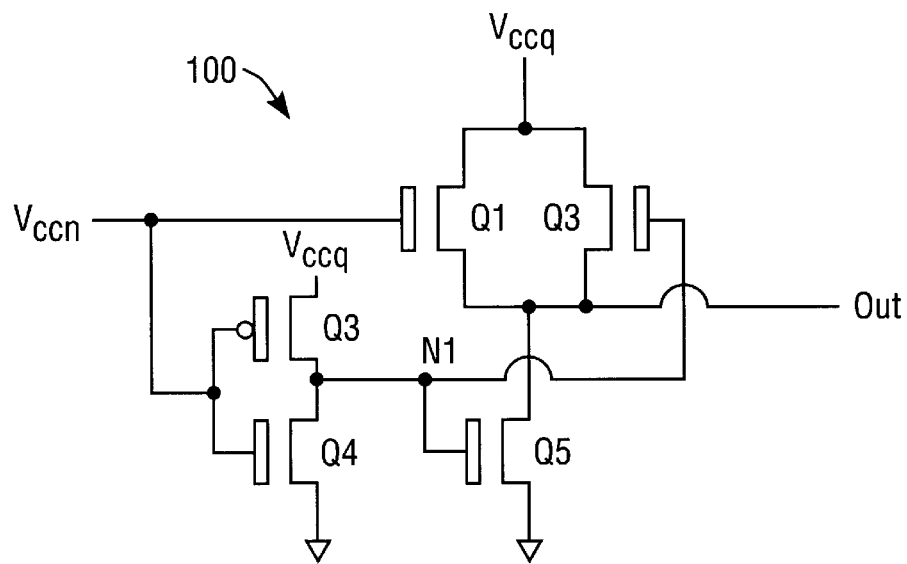
FIG. 6 illustrates a shut-off circuit in accordance with an embodiment of the invention.

FIG. 3 also illustrates a shut-off circuit 100. FIG. 6 illustrates an embodiment of the shut-off circuit 100. The shut-off circuit 100 may be implemented as a logical AND gate. That is, the circuit 100 generates a digital high weak active pull-up signal only when both Vccn and Vccq have digital high values. Otherwise, the circuit 100 generates a digital low isolation signal. The isolation signal is used to prevent the weak active pull-up circuit 102 from charging up the floating well (node 72 of FIG. 3) when the noisy voltage supply is still at a digital zero. The floating well 72 should only be charged up by the pin connected to the Dout node 51 or by the noisy voltage supply.

Figure 7:
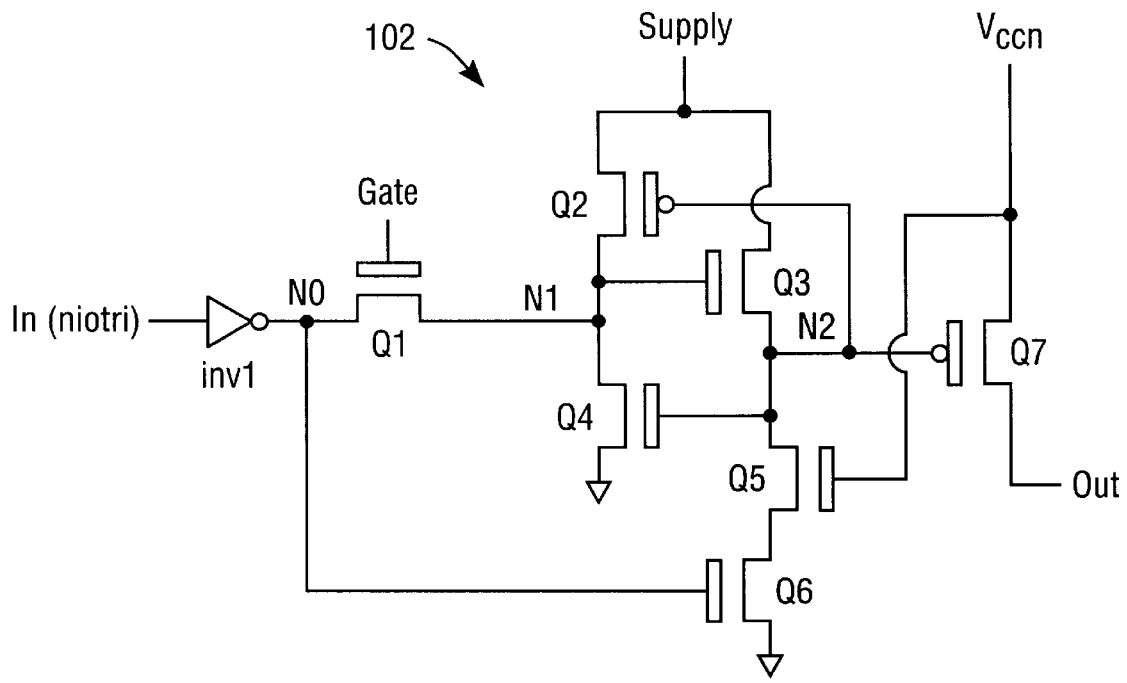
FIG. 7 illustrates a Weak Active Pull-Up circuit in accordance with an embodiment of the invention.

FIG. 3 illustrates the weak active pull-up circuit 102 in connection with the other circuit elements of the invention. FIG. 7 provides a detailed schematic of an embodiment of the weak active pull-up circuit 102. The digital low isolation signal from the shut-off circuitry 100 is applied the "gate" node of transistor Q1 of FIG. 7. Observe that this digital low signal keeps transistor Q1 off. Transistor Q1 thereby provides isolation from a digital high value on node N0. A digital high value on node N0 results when a digital low NIOTRI signal is applied to the input of inverter INV1. The digital low NIOTRI signal is used while a PLD 20 associated the buffer 50 is being programmed. By providing isolation from the digital high signal at node N0, the node "supply" of FIG. 7, which is connected to node 72 of FIG. 3, is prevented from being driven to a digital high value by the inverter INV1, via transistors Q1 and Q2.

When the digital high weak active pull-up signal is applied to the "gate" node of transistors Q1 of FIG. 7, the transistor Q1 turns-on. Thus, during a programming state, the digital low NIOTRI signal results in a digital high signal at the output of inverter "INV1". This digital high signal is passed by the Q1 transistor to the node N1. The digital high signal causes transistor Q3 to shut-off. Thus, node N2 is pulled down to a digital low value once transistors Q5 turns-on in response to a digital high Vccn. The digital low value on node N2 causes transistor Q7 to turn-on, driving the output node "out" to Vccn. Since the digital high value Vccn at the "out" node of FIG. 7 is tied to the output node 51 of FIG. 3, the output node 51 is pulled to a digital high value, even when transistors MP6, MN5, and MN15 are all off during a programming operation. In the prior art, a weak resistor is used on a printed circuit board to pull-up the output node 51 during programming. The shut-off circuit 100 and weak active pull-up circuit 102 of the invention eliminate the need for an external resistor. Thus, the output buffer of the present invention may be used to simplify and reduce the expense of printed circuit boards that support the PLD of the invention.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following Claims and their equivalents.

What is claimed is:

1. An output buffer, comprising:
   an input node;
   an output node;
   internal circuitry connected between said input node and said output node, said internal circuitry including a quiet voltage supply connected to a first set of transistors of said internal circuitry and a noisy voltage supply connected to a second set of transistors of said internal circuitry, wherein said noisy voltage supply is at a voltage level higher than said quiet voltage supply and said first set of transistors and said second set of transistors provide isolation between said noisy voltage supply and said quiet voltage supply; and
   a ground bounce circuit that operates, in the presence of ground bounce, to shut-off a pull-down transistor connected to said output node.

2. The output buffer of claim 1 further comprising a slew rate control circuit connected to said output node, said slew rate control circuit controlling the gate voltage at a pull-up transistor connected to said output node.

3. The output buffer of claim 2 wherein said slew rate control circuit includes a first pull-down transistor connected to the gate of said pull-up transistor.

4. The output buffer of claim 1 further comprising a transition accelerator circuit to accelerate the shut-off of a pull-down circuit connected to said output node.

5. The output buffer of claim 1 further comprising a Personal Computer Interface (PCI) compatibility circuit to facilitate output buffer signal levels compatible with the PCI standard.

6. The output buffer of claim 1 in combination with a programmable logic device.

7. The output buffer of claim 1 in combination with a programmable logic device forming a portion of a data processing system.

8. An output buffer, comprising:
   an input node;
   an output node;
   internal circuitry connected between said input node and said output node, said internal circuitry including a quiet voltage supply connected to a first set of transistors of said internal circuitry and a noisy voltage supply connected to a second set of transistors of said internal circuitry, wherein said noisy voltage supply is at a voltage level higher than said quiet voltage supply and said first set of transistors and said second set of transistors provide isolation between said noisy voltage supply and said quiet voltage supply; and
   a slew rate control rate control circuit connected to said output node, said slew rate control circuit controlling the gate voltage at a pull-up transistor connected to said output node, wherein said slew rate control circuit includes a first pull-down transistor connected to the gate of said pull-up transistor, and wherein said slew rate control circuit further includes:
      a second pull-down transistor connected to said first pull-down transistor;
      a third pull-down transistor connected to said first pull-down transistor, said third pull-down transistor having a resistivity larger than the resistivity of said second pull-down transistor; and
      a programmable element to alternately turn-on said second pull-down transistor or said third pull-down transistor.

9. An output buffer, comprising:
   an input node;
   an output node;
   internal circuitry connected between said input node and said output node, said internal circuitry including a quiet voltage supply connected to a first set of transistors of said internal circuitry and a noisy voltage supply connected to a second set of transistors of said internal circuitry, wherein said noisy voltage supply is at a voltage level higher than said quiet voltage supply and said first set of transistors and said second set of transistors provide isolation between said noisy voltage supply and said quiet voltage supply; and a Personal Computer Interface (PCI) compatibility circuit to facilitate output buffer signal levels compatible with the PCI standard, said PCI control circuit alternately forcing said PCI compatibility circuit to generate output buffer signal levels compatible with said PCI standard or facilitate isolation from voltage levels on said output node that are greater than said noisy voltage supply voltage level.

10. An output buffer, comprising:

an input node;

an output node;

internal circuitry connected between said input node and said output node, said internal circuitry including a quiet voltage supply connected to a first set of transistors of said internal circuitry and a noisy voltage supply connected to a second set of transistors of said internal circuitry, wherein said noisy voltage supply is at a voltage level higher than said quiet voltage supply and said first set of transistors and said second set of transistors provide isolation between said noisy voltage supply and said quiet voltage supply; and a shut-off circuit to generate a digital low isolation signal to facilitate a digital low signal on said output node until said quiet voltage supply and said noisy voltage supply reach a digital high level.

11. The output buffer of claim 10 further comprising a weak active pull-up circuit to generate a digital low signal on said output node in response to said isolation signal.

12. The output buffer of claim 11 wherein said shut-off circuit generates a digital high weak active pull-up signal during a programming state when said quiet voltage supply and said noisy voltage supply reach a digital high value.

13. The output buffer of claim 12 wherein said weak active pull-up circuit generates a digital high signal on said output node in response to said weak active pull-up signal.

14. An output buffer, comprising:

an input node;

an output node;

internal circuitry connected between said input node and said output node, said internal circuitry including a quiet voltage supply connected to a first set of transistors of said internal circuitry and a noisy voltage supply connected to a second set of transistors of said internal circuitry, wherein said noisy voltage supply is at a voltage level higher than said quiet voltage supply and said first set of transistors and said second set of transistors provide complete digital high and low internal signal levels by using at least one transistor operative to supplement the complete shut-off and turn-on of transistors of said first set of transistors and said second set of transistors; and a ground bounce circuit that operates, in the presence of ground bounce to shut-off a pull-down transistor connected to said output node.

15. The output buffer of claim 14 wherein said internal circuitry includes a level shifting circuit, said level shifting circuit comprising:

a level shifting circuit intermediate input node;

a level shifting circuit output node;

an inverter connected between said level shifting circuit intermediate input node and said level shifting circuit output node, said inverter including a pull-up transistor and a pull-down transistor; and a voltage shifting PMOS transistor connected to said inverter to completely shut-off said pull-up transistor and turn-on said pull-down transistor, thereby enabling full digital high and digital low output values at said level shifting circuit output node.

16. The level shifting circuit of claim 14 wherein said first set of transistors and said second set of transistors provide isolation between said noisy voltage supply and said quiet voltage supply.

* * * * *